(12) United States Patent
Sasa et al.

(10) Patent No.: US 8,597,475 B2
(45) Date of Patent: *Dec. 3, 2013

(54) TRANSPARENT CONDUCTIVE LAMINATE AND PROCESS OF PRODUCING THE SAME

(75) Inventors: Kazuaki Sasa, Ibaraki (JP); Kazunori Kawamura, Ibaraki (JP); Keiko Toyozawa, Ibaraki (JP); Tomohiko Maeda, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 899 days.

This patent is subject to a terminal disclaimer.

(21) Appl. No.: 11/101,548

(22) Filed: Apr. 8, 2005

(65) Prior Publication Data

US 2005/0173706 A1    Aug. 11, 2005

Related U.S. Application Data

(62) Division of application No. 10/407,421, filed on Apr. 7, 2003, now Pat. No. 6,908,666.

(30) Foreign Application Priority Data

Apr. 8, 2002  (JP) .............................. P. 2002-104676

(51) Int. Cl.
  *C23C 14/00*  (2006.01)
  *C23C 14/32*  (2006.01)

(52) U.S. Cl.
  USPC ............ 204/192.29; 204/192.13; 204/192.15; 204/192.26

(58) Field of Classification Search
  USPC ......... 428/469; 313/506; 204/192.15, 192.26, 204/192.29
  See application file for complete search history.

(56) References Cited

U.S. PATENT DOCUMENTS

| | | | | |
|---|---|---|---|---|
| 4,835,061 A | * | 5/1989 | Ohta et al. | 428/469 |
| 5,225,273 A | | 7/1993 | Mikoshiba et al. | |
| 5,750,267 A | * | 5/1998 | Takase et al. | 428/469 |
| 6,351,068 B2 | * | 2/2002 | Yamazaki et al. | 313/506 |
| 6,617,056 B1 | | 9/2003 | Hara et al. | |
| 7,763,151 B2 | * | 7/2010 | Noguchi et al. | 204/192.29 |

FOREIGN PATENT DOCUMENTS

| | | | |
|---|---|---|---|
| JP | 3-15536 | | 3/1991 |
| JP | 08-064034 A | | 3/1996 |
| JP | 09234816 A | * | 9/1997 |
| JP | 11-288625 A | | 10/1999 |

(Continued)

OTHER PUBLICATIONS

Machine Translation JP No. 08064034.*

(Continued)

*Primary Examiner* — Michael Band
(74) *Attorney, Agent, or Firm* — Sughrue Mion, PLLC

(57) ABSTRACT

A transparent conductive laminate having a completely crystallized, transparent conductive layer on a substrate comprising an organic polymer molding, and a process for producing the same. The transparent conductive layer is excellent in transparency and wet heat confidence and is not excessively low in specific resistivity. The transparent conductive laminate includes a substrate comprising an organic polymer molding having formed thereon a completely crystallized, transparent conductive layer comprising an In.Sn composite oxide having an amount of Sn atom of 1 to 6% by weight based on the total weight of In atom and Sn atom and having a film thickness of 15 to 50 nm, a Hall mobility of 30 to 45 $cm^2/V \cdot S$, and a carrier density of from $2 \times 10^{20}/cm^3$ to $6 \times 10^{20}/cm^3$.

4 Claims, 1 Drawing Sheet

(56) References Cited

FOREIGN PATENT DOCUMENTS

| JP | 2000144379 | 5/2000 |
| JP | 2000-265259 A | 9/2000 |
| WO | WO 00/51139 | 8/2000 |
| WO | WO 0051139 A1 * | 8/2000 |

OTHER PUBLICATIONS

Machine Translation JP No. 09234816.*
T. Minami, et al. "Physics of very thin ITO conducting films with high transparency prepared by DC magnetron sputtering" Thin Solid Films, Elsevier-Sequoia S.A. Lausanne, CH, vol. 270, No. 1/2, Dec. 1, 1995, pp. 37-42. XP000595205 ISSN: 0040-6090, Abstract.
Danson N. et al. "Techniques for the sputtering of optimum indium-tin oxide films on to room-temperature substrates" Surface and coatings Technology, Feb. 5, 1998, Elsevier, Switzerland vol. 99, No. 1-2, pp. 147-160, XP002255051 ISSN: 0257-8972.
Suzuki M. et al. "Enhanced Electrical Conductivity of Indium tin Oxide Films by Ag Addition" Japanese Journal of Applied Physics, Part 1 (regular papers, short notes & review papers), Jan. 1998, Publication Office Japanese Joural Appl. Phys., Japan, vol. 37, No. 1, pp. 34-38, XP002255052 ISSN: 0021-4922.
Japanese Office Action dated Nov. 24, 2005 for JP Application No. 2002-104676, English-language translation.

\* cited by examiner

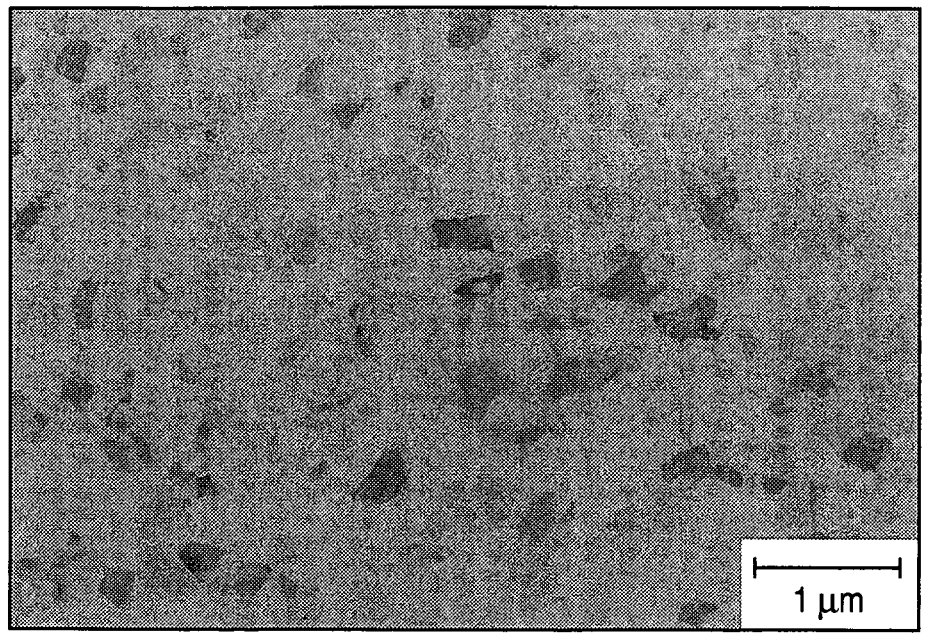

TRANSPARENT CONDUCTIVE LAMINATE AND PROCESS OF PRODUCING THE SAME

This application is a divisional of U.S. patent application Ser. No. 10/407,421, filed Apr. 7, 2003 (now U.S. Pat. No. 6,908,666), which claims benefit to Japanese Patent Application No. 2002-104676, filed Apr. 8, 2002. The above-noted applications are incorporated by reference in their entirety.

FIELD OF THE INVENTION

The present invention relates to a transparent conductive laminate comprising a substrate comprising an organic polymer molding and a transparent conductive layer comprising an In.Sn composite oxide, formed on the substrate, and a process for producing the same.

DESCRIPTION OF THE RELATED ART

Such kinds of transparent conductive laminates are widely utilized as transparent electrodes for inorganic electroluminescent elements, transparent electrodes for electromagnetic radiation shields, transparent electrodes for analog/digital touch panels, and the like. Especially, in recent years, with the information infrastructure and the rapid diffusion of portable communication assistants represented by personal digital assistant (PDA), a demand for utilization of touch panels is rapidly spreading.

Such a touch panel of portable communication assistant is set on a liquid crystal display screen and can be subjected to graphic input by an exclusive pen in place of a keyboard, thereby enabling to display liquid crystals directly under a transparent input section. A person can recognize the information of the displayed liquid crystals through the touch panel as a transparent input element. In recent years, as the image quality of the liquid crystals of the portable communication assistant becomes sharp, a transparent electrode layer for touch panel to be set thereon is demanded to have high transparency.

Hitherto, transparent electrode laminates to be used for such utilization have been prepared by vapor deposition, ion plating, sputtering, or the like. From the standpoint of controllability and reproducibility, the sputtering is most generally employed. The sputtering is a method in which by using an oxide target identical with a film composition of a transparent conductive layer to be formed on a substrate, or metal target made of an In—Sn alloy, an inert gas (such as Ar gas) is introduced singly or together with a reactive gas (such as oxygen gas) to form a transparent conductive layer made of an In.Sn composite oxide on the substrate by sputter film formation. However, in the case where the substrate is made of an organic polymer molding, the film cannot be fabricated at high temperature because of poor heat resistance of the substrate, and immediately after the film formation, an amorphous film is partly crystallized in the resulting film. For this reason, the film product involved problems such that the transparency of the film is poor, yellowing of the film is highly observed, and that the change in resistivity after the wet heat test is large.

In order to overcome these problems, as means for forming a crystallized film on a substrate made of an organic polymer molding, JP-B-3-15536 proposes a technology in which a film is fabricated while reducing the amount of oxygen, and the resulting film is post-heated in an oxygen atmosphere in air to convert an amorphous film into a crystallized film. This proposed process gives rise to advantages such that the transparency of the film is enhanced, the yellowing does not occur, and that the change in resistivity after the wet heat test is small, so that the wet heat confidence is enhanced.

However, according to the above-described process of performing the post-heating, crystallization is not completed within a short period of time, but long-term heating at high temperature is required. For this reason, the productivity is poor, and there is a problem in product quality, such as formation of oligomers in the substrate film. Further, there was a problem that a specific resistivity of the resulting crystallized film is too low, thereby increasing a consumed electric power.

SUMMARY OF THE INVENTION

Under these circumstances, an object of the invention is to provide a transparent conductive laminate comprising a substrate comprising an organic polymer molding having formed thereon a completely crystallized, transparent conductive layer which is free from deteriorations in productivity and product quality, is excellent in transparency and wet heat confidence, and is not too low in specific resistivity, by sputter film formation at a substrate temperature of 150° C. or lower, at which the substrate can thoroughly withstand, and then heat treating the film at low temperature for a short period of time.

The term "completely crystallized" as referred to herein means a state in which crystallized grains are present over the entire surface of the film by observation with a transmission electron microscope (TEM).

As a result of extensive and intensive investigations to achieve the above-described object, it has been found that in sputter film-forming a transparent conductive layer comprising an In.Sn composite oxide on a substrate comprising an organic polymer molding at a temperature of 80 to 150° C., which is a practically allowable heating temperature of the substrate, when the transparent conductive layer having a specified film thickness is formed by sputtering under conditions that the content of Sn in a target is low, an atmosphere where evacuation is performed to a prescribed degree of vacuum, thereby eliminating the moisture and impurities such as organic gases generated from the substrate, is employed, and that an oxygen gas in a slight amount such that the plasma emission intensity of In delicately fluctuates is introduced thereinto together with an Ar gas, the transparent conductive layer immediately after the film formation is an amorphous film, but when the resulting film is heat-treated in air at low temperature of 120 to 150° C. for a short period of time of 0.5 to 1 hour, the film can be easily converted into a completely crystallized film without causing deteriorations in productivity and material quality.

Moreover, the completely crystallized film by the above specified heat treatment increased in its Hall mobility from 15 to 28 $cm^2/V \cdot S$ before the heat treatment to 30 to 45 $cm^2/V \cdot S$ after the heat treatment, but did not greatly change in a carrier density, i.e., the carrier density before the heat treatment was $2 \times 10^{20}/cm^3$ to $5 \times 10^{20}/cm^3$, and the carrier density after the heat treatment was $2 \times 10^{20}/cm^3$ to $6 \times 10^{20}/cm^3$. In contrast, the crystallized film obtained by long-term post-heat treatment at high temperature after the sputter film-formation as proposed by JP-B-3-15536 has a Hall mobility of 18 to 20 $cm^2/V \cdot S$ and a carrier density of $5 \times 10^{21}/cm^3$ to $9 \times 10^{21}/cm^3$.

In summary, the completely crystallized film by the above specified heat treatment has peculiar properties such that the Hall mobility is about two times higher and that the carrier density is lower by one order, as compared with the crystallized film as proposed by the above-cited patent (JP-B-3-15536). Further, it has also been found that based on these properties, the completely crystallized film is excellent in transparency and wet heat confidence as a transparent conductive film and that its reduction in specific resistivity is limited only to about a half of that before the heat treatment (i.e., immediately after the sputter film formation) so that an excessive reduction of the specific resistivity is prevented as compared with the crystallized film as proposed by the above-cited patent (JP-B-3-15536), in which the specific resistivity is reduced by more than one order after the post-heat treatment, and that an increase in consumed electric power can be suppressed.

The invention has been completed based on these findings.

Accordingly, the invention provides a transparent conductive laminate comprising a substrate comprising an organic polymer molding, and formed on the substrate a completely crystallized, transparent conductive layer comprising an In.Sn composite oxide having an amount of Sn atom of 1 to 6% by weight, preferably 2 to 5% by weight, based on the total weight of In atom and Sn atom and having a film thickness of 15 to 50 nm, preferably 20 to 40 nm, a Hall mobility of 30 to 45 $cm^2/V·S$, and a carrier density of $2\times10^{20}/cm^3$ to $6\times10^{20}/cm^3$.

The invention further provides a process for producing the transparent conductive laminate, which comprises:
(a) a step of sputter film-forming a transparent conductive layer comprising an In.Sn composite oxide on a substrate comprising an organic polymer molding, and
(b) a step of subsequent post-heating to produce a transparent conductive laminate having the transparent conductive layer on the substrate,
wherein the step (a) is a step in which a metal target or an oxide target having an amount of Sn atom of 1 to 6% by weight based on the total weight of In atom and Sn atom is used, evacuation is performed to a degree of vacuum of $1.5\times10^{-4}$ Pa or lower at a substrate temperature of 80 to 150° C., and an oxygen gas is introduced thereinto together with an Ar gas such that when a plasma emission intensity of In when only the Ar gas is introduced is defined to be 90, the emission intensity after the introduction of oxygen gas is 30 to 40 for the metal target and 84 to 90 for the oxide target, respectively, to form an amorphous transparent conductive layer comprising an In.Sn composite oxide having an amount of Sn atom of 1 to 6% by weight based on the total weight of In atom and Sn atom and having a film thickness of 15 to 50 nm, a Hall mobility of 15 to 28 $cm^2/V·S$, and a carrier density of $2\times10^{20}/cm^3$ to $5\times10^{20}/cm^3$ on the substrate; and
the step (b) is a step in which the amorphous transparent conductive layer formed in the step (a) is subjected to heat treatment in air at 120 to 150° C. for 0.5 to 1 hour, to convert it into a completely crystallized transparent conductive layer having a Hall mobility of 30 to 45 $cm^2/V·S$ and a carrier density of $2\times10^{20}/cm^3$ to $6\times10^{20}/cm^3$.

BRIEF DESCRIPTION OF THE DRAWING

The FIGURE is a microscopic photograph of a transparent conductive layer comprising an ITO film having been subjected to sputter film-formation and heat treatment at low temperature for a short period of time by the method of Example 1, by observation with a transmission electron microscope (magnification: 25,000 times).

DETAILED DESCRIPTION OF THE INVENTION

The substrate used in the invention comprises an organic polymer molding, and organic polymer having excellent transparency and heat resistance are preferably used. Examples of such an organic polymer include polyester-based polymers such as polyethylene terephthalate; polyolefin-based polymers; homopolymers such as polycarbonates, polyether sulfones, and polyarylates; copolymers; and epoxy-based polymers. Such an organic polymer is molded into a film-like form, a sheet-like form, or other forms and then provided for the use. If desired, the molding may be provided with an undercoat or a back-side coat.

In the step (a), a transparent conductive layer comprising an In.Sn composite oxide is formed on the substrate by sputter film formation. This film formation can use not only a standard magnetron sputtering process using a DC power source but also various sputtering processes such as an RF sputtering process, an (RF+DC) sputtering process, a pulse sputtering process, and a dual magnetron sputtering process. In sputter film-forming, the substrate temperature must be within the range of from 80 to 150° C. in order to not thermally damage the substrate. By selecting a higher substrate temperature within this specified range, good results for crystallization of the transparent conductive layer to be formed can be obtained. Usually, the substrate temperature is set at about 100° C.

The sputter target used in the invention is a metal target (In—Sn target) or an oxide target ($In_2O_3$—$SnO_2$ target), having an amount of Sn of 1 to 6% by weight, preferably 2 to 5% by weight, based on the total weight of In atom and Sn atom. Addition of Sn contributes to enhancement of confidence such as durability of the film. However, so far as the crystallization is concerned, $In_2O_3$ is most likely crystallized. Exclusive of the amount of Sn to be incorporated into the $In_2O_3$ crystal lattices, Sn acts as an impurity to suppress the crystallization. For this reason, the amount of Sn must be controlled within the above-specified range.

In conducting the sputter film formation using such a target, the inside of a sputtering device is first evacuated to a degree of vacuum of $1.5\times10^{-4}$ Pa or less, and preferably $7\times10^{-5}$ Pa or less, to prepare an atmosphere from which moisture within the device and organic gases generated from the substrate have been eliminated. The reason for this is that during the film formation, the presence of the moisture or organic gases terminates a dangling bond generated during the film formation to suppress the crystal growth.

Next, an oxygen gas as a reactive gas is introduced together with an Ar gas as an inert gas into the thus evacuated sputtering device, and the sputter film formation is performed. During this time, it is important to delicately control the amount of the oxygen gas introduced. According to a general method of introducing a constant amount of the oxygen gas by means of a mass flow controller, since the degree of oxidation of the target surface fluctuates every mount, and a hysteresis of oxidation is present, it is impossible to perform the film formation of a crystallized film in a stable manner even by the heat treatment after the film formation.

The present inventors made extensive and intensive investigations on a PEM (plasma emission monitor) control system utilizing the matter that the plasma emission intensity of In as generated during the sputtering discharge is related to the film formation speed and the film quality relying on the degree of oxidation of the sputtering target. As a result, it has been found that when the plasma emission intensity of In during the sputter film formation when only the Ar gas is introduced is defined to be 90, if the oxygen gas is introduced such that the emission intensity after the introduction of oxygen gas is 30 to 40 for the metal target and 84 to 90 for the oxide target, a film that is amorphous during the sputter film formation can be easily converted into a completely crystallized film by the subsequent heat treatment in air at low temperature for a short period of time.

In the method of introducing an oxygen gas such that the In emission intensity after introduction of the oxygen gas falls within the above-specified range, a change of the amount of oxygen after the introduction is so little that it cannot be determined at a certain instance by a mass flow meter. Incidentally, with respect to the resistivity of the film, it has been confirmed that it exhibits a minimum value when the In emission intensity is 30 for the metal target and 84 for the oxide target, respectively.

In the invention, by setting the amount of the oxygen gas introduced within a slight range, when the film after the sputter film formation on the substrate is heat treated at low temperature for a short period of time, it is possible to obtain a transparent conductive laminate having a completely crystallized transparent conductive layer as described above. During the sputter film formation, the film thickness of the transparent conductive layer should be in the range of from 15 to 50 nm, and particularly preferably from 20 to 40 nm. When the film thickness of the transparent conductive layer is less than 15 nm, the crystallization hardly occurs by the heat treatment at low temperature for a short period of time, whereas when it exceeds 50 nm, the specific resistivity excessively decreases by the heat treatment, so that the consumed electric power for the touch panel electrodes is liable to increase.

The transparent conductive layer formed by sputtering on the substrate is an amorphous film comprising an In.Sn composite oxide having an amount of Sn atom of 1 to 6% by weight based on the total weight of In atom and Sn atom and having a film thickness of 15 to 50 nm, in which the Hall mobility is 15 to 28 $cm^2/V \cdot S$, and the carrier density is $2 \times 10^{20}/cm^3$ to $5 \times 10^{20}/cm^3$.

In the case where the transparent conductive laminate of the invention is utilized for touch panels, it is subjected to pattern etching processing with an acid. The pattern etching process is carried out at a stage immediately after the sputter film formation, namely at a stage before the heat treatment. After the heat treatment, the film is completely crystallized so that the etching processing is difficult. On the other hand, before the heat treatment, the film is an amorphous film so that the etching processing can be easily carried out.

In the subsequent step (b), the transparent conductive layer after the sputter film formation is subjected to heat treatment in air at low temperature for a short period of time. That is, the heat treatment is carried out at 120 to 150° C. for from 0.5 to 1 hour by properly using a dryer, etc. According to this heat treatment, the amorphous film after the sputter film formation is converted into a completely crystallized film having a Hall mobility of a larger value of 30 to 45 $cm^2/V \cdot S$ and a carrier density of substantially the same value of $2 \times 10^{20}/cm^3$ to $6 \times 10^{20}/cm^3$. This Hall mobility is about two times higher as compared with that of the crystallized film proposed by the above-cited patent (JP-B-3-15536), and this carrier density is lower by approximately one order as compared with that of the crystallized film as proposed by the above-cited patent (JP-B-3-15536).

In general, it is said that donors generated by carrier electrons of a transparent conductive layer comprising an In.Sn composite oxide include an oxygen-deficient portion of an $In_2O_3$ fluorite crystal lattice and a portion where Sn atom substitutes in the In atom site.

In the invention, since the doping amount of Sn is low, the amount of the Sn atom substituted in the In atom site is low. Accordingly, it may be considered that this matter is a cause to make the carrier density low. Further, in the invention, the content of excessive Sn functioning as an impurity and the content of moisture are low. Accordingly, it may also be considered that in spite of the heat treatment at low temperature for a short period of time, this matter is a cause to largely grow the crystals, thereby making the Hall density large.

As described above, the transparent conductive layer after the heat treatment has peculiar properties (i.e., novel Hall mobility and carrier density) as a transparent conductive layer to be provided on a substrate comprising an organic polymer molding, which have not hitherto been reported. Especially, it can be said that the transparent conductive layer after the heat treatment of the invention is a completely crystallized film where crystals grow very well.

For this reason, the transparent conductive layer after the heat treatment exhibits excellent transparency such that light transmittance at 550 nm is enhanced by from about 1.5 to 4% as compared with that before the heat treatment. Especially, the enhancement in the light transmittance at a wavelength side shorter than 550 nm is remarkable. Further, the transparent conductive layer after the heat treatment does not exhibit a yellowing phenomenon and is low in the change of resistivity in the wet heat test, so that it is excellent in wet heat confidence. Moreover, in the transparent conductive layer after the heat treatment, the specific resistivity is about a half value of that before the heat treatment, and reduction rate of the specific resistivity by the heat treatment is low. Thus, an increase in the consumed electric power as touch panel electrodes can be prevented.

Incidentally, in the step (b), when the temperature and time for the heat treatment fall outside the above-specified ranges, the above-described effects are not obtained. For example, when the heat treatment temperature is lower than 120° C., or the heat treatment time is shorter than 0.5 hour, the complete crystallization is hardly achieved. On the other hand, when the heat treatment temperature exceeds 150° C., or the heat treatment time exceeds 1 hour, reduction in the productivity or problems in material quality, such as generation of oligomers in the substrate film, are liable to occur. Further, a transparent conductive layer exhibiting the above-described film properties is hardly obtained. Moreover, inconveniences such an excessive reduction of specific resistivity likely occur.

The present invention will be described in more detail below with reference to the following Examples, but it should be understood that the invention is not construed as being limited thereto.

EXAMPLE 1

An In—Sn metal target (amount of Sn atom: 3% by weight based on the total weight of In atom and Sn atom) as a target material and a polyethylene terephthalate (hereinafter referred to as "PET") film having a thickness of 75 µm as a substrate were installed in a rolling up-type magnetron sputtering device of parallel plate type. The device was subjected to dehydration and degassing and evacuated to a degree of vacuum of $7 \times 10^{-5}$ Pa while rolling up.

In this state, sputter film formation was carried out by a reactive sputtering process with a 3 kW DC by introducing 300 sccm of an Ar gas by heating at a substrate temperature of 100° C. and by setting a plasma emission intensity of In by only the Ar gas at 90 and then regulating an amount of an oxygen gas introduced while opening and closing an automatic piezo valve such that the emission intensity after the introduction of oxygen gas became 33 by PEM, to adjust the film quality.

There was thus formed a 20 nm thick transparent conductive layer made of a transparent In.Sn composite oxide (hereinafter referred to as "ITO") on the substrate made of the PET film. The transparent conductive layer was then subjected to heat treatment by heating at 150° C. for 30 minutes to prepare a transparent conductive laminate. With respect to this laminate, the transparent conductive layer was observed by a transmission electron microscope (TEM) (magnification: 25,000 times). As a result, it was observed that the completely crystallized ITO film was formed as shown in the FIGURE.

Further, with respect to this transparent conductive laminate, the Hall mobility and carrier density before the heat treatment (immediately after the sputter film formation) and after the heat treatment were measured by the Hall effect measurement. The measurement was carried out using a "HL5500PC" measurement system manufactured by BIO RAD. In addition, the resistivity, the light transmittance at 550 nm, and the resistivity five minutes after immersion in a 5% HCl aqueous solution were measured before and after the heat treatment. The results obtained are shown in Table 1 below.

TABLE 1

|   | Before heat treatment | After heat treatment |
|---|---|---|
| Hall mobility ($cm^2/V \cdot S$) | 21.2 | 37.3 |
| Carrier density (number/$cm^3$) | $3.7 \times 10^{20}$ | $4.2 \times 10^{20}$ |
| Resistivity (Ω/square) | 400 | 200 |
| Light transmittance (%) | 85 | 88 |
| Resistivity five minutes after immersion in 5% HCl aqueous solution (Ω/square) | ∞ | 200 |

As is clear from the above results, nevertheless the transparent conductive layer was a thin film having a thickness of 20 nm, which should have been originally hardly crystallized, it was well crystallized by the heat treatment at low temperature (150° C.) for a short period of time (30 minutes), so that the light transmittance at 550 nm was enhanced by 3% as compared with that before the heat treatment. Further, the reduction in the resistivity after the heat treatment was suppressed to a half of that before the heat treatment, so that there is no anxiety that the resistivity becomes excessively low by the heat treatment.

Moreover, before the heat treatment, the resistivity five minutes after the immersion in a 5% HCl aqueous solution is indefinite (∞), i.e., the film can be easily subjected to etching processing with an acid. On the other hand, after the heat treatment, any change was not found at all in the resistivity five minutes after the immersion in a 5% HCl aqueous solution, and hence, it is difficult to undergo the etching processing with an acid. In other words, the resulting film is stable against the acid.

Still further, separately from the above tests, the transparent conductive laminate after the heat treatment was subjected to wet heat test at 60° C. and at 90% RH for 500 hours. As a result, the change rate in resistivity against the initial resistivity before the test (200 Ω/square) was suppressed to 1.1 times. Therefore, the transparent conductive laminate after the heat treatment was also excellent in wet heat confidence.

EXAMPLE 2

An In—Sn oxide target (amount of Sn atom: 4.7% by weight based on the total weight of In atom and Sn atom) as a target material and a PET film having a thickness of 75 μm as a substrate were installed in a rolling up-type magnetron sputtering device of parallel plate type. The device was subjected to dehydration and degassing and evacuated to a degree of vacuum of $1 \times 10^{-4}$ Pa while rolling up.

In this state, sputter film formation was carried out in a reactive sputtering process with a 3 kW DC by introducing 300 sccm of an Ar gas by heating at a substrate temperature of 100° C. and by setting a plasma emission intensity of In by only the Ar gas at 90 and then regulating an amount of an oxygen gas introduced while opening and closing an automatic piezo valve such that the emission intensity after the introduction of oxygen gas became 86 by PEM, to adjust the film quality.

There was thus formed a 20 nm-thick transparent conductive layer made of a transparent ITO film on the substrate made of the PET film. The transparent conductive layer was then subjected to heat treatment by heating at 150° C. for 30 minutes to prepare a transparent conductive laminate. With respect to this laminate, the transparent conductive layer was observed by a transmission electron microscope. As a result, the completely crystallized ITO film was formed.

Further, with respect to this transparent conductive laminate, the Hall mobility and carrier density before the heat treatment (immediately after the sputter film formation) and after the heat treatment were measured in the same manner as described above. In addition, the resistivity, the light transmittance at 550 nm, and the resistivity five minutes after immersion in a 5% HCl aqueous solution were measured before and after the heat treatment. As a result, substantially the same results as in Example 1 were obtained as shown in Table 2 below. Moreover, separately from the above tests, the transparent conductive laminate after the heat treatment was subjected to wet heat test in the same manner as described above. As a result, the transparent conductive laminate after the heat treatment was excellent in wet heat confidence as in Example 1.

TABLE 2

|   | Before heat treatment | After heat treatment |
|---|---|---|
| Hall mobility ($cm^2/V \cdot S$) | 24.2 | 37.1 |
| Carrier density (number/$cm^3$) | $3.4 \times 10^{20}$ | $4.0 \times 10^{20}$ |
| Resistivity (Ω/square) | 380 | 210 |
| Light transmittance (%) | 85 | 88 |
| Resistivity five minutes after immersion in 5% HCl aqueous solution (Ω/square) | ∞ | 210 |

COMPARATIVE EXAMPLE 1

The sputter film formation was carried out in the same manner as in Example 1, except for changing the target material to an In—Sn metal target (amount of Sn atom: 10% by weight based on the total weight of In atom and Sn atom). There was thus formed a 20 nm thick transparent conductive layer made of an ITO film on a substrate made of a PET film. This transparent conductive layer was then subjected to heat treatment by heating at 150° C. for 30 minutes to prepare a transparent conductive laminate.

With respect to this transparent conductive laminate, the Hall mobility and carrier density before the heat treatment (immediately after the sputter film formation) and after the heat treatment were measured in the same manner as described above. In addition, the resistivity, the light transmittance at 550 nm, and the resistivity five minutes after immersion in a 5% HCl aqueous solution were measured before and after the heat treatment. The results obtained are shown in Table 3 below.

TABLE 3

|  | Before heat treatment | After heat treatment |
|---|---|---|
| Hall mobility ($cm^2/V \cdot S$) | 20.1 | 23.5 |
| Carrier density (number/$cm^3$) | $3.8 \times 10^{20}$ | $3.8 \times 10^{20}$ |
| Resistivity ($\Omega$/square) | 410 | 350 |
| Light transmittance (%) | 84.5 | 85 |
| Resistivity five minutes after immersion in 5% HCl aqueous solution ($\Omega$/square) | $\infty$ | $\infty$ |

As is clear from the above results, an enhancement in the light transmittance before and after the heat treatment was not substantially found; and the resistivity five minutes after the immersion in a 5% HCl aqueous solution was also indefinite ($\infty$) even after the heat treatment. Hence, although the etching processing with an acid could be performed, the resulting film was poor in stability against an acid in proportion thereto. Incidentally, separately from the above tests, the transparent conductive laminate after the heat treatment was subjected to wet heat test in the same manner as described above. As a result, the change rate in resistivity against the initial resistivity before the test became 1.5 times. Therefore, the transparent conductive laminate after the heat treatment was poor in wet heat confidence as compared with that in Example 1.

COMPARATIVE EXAMPLE 2

The sputter film formation was carried out in the same manner as in Example 2, except that the target material was changed to an In—Sn oxide target (amount of Sn atom: 9.5% by weight based on the total weight of In atom and Sn atom), the evacuation was performed to a degree of vacuum of $8 \times 10^{-4}$ Pa, and that after setting the plasma emission intensity of In by only the Ar gas at 90, the amount of oxygen gas introduced was regulated while opening and closing an automatic piezo valve such that the emission intensity after the introduction of oxygen gas became 80. There was thus formed a 20 nm thick transparent conductive layer made of an ITO film on a substrate made of a PET film. This transparent conductive layer was then subjected to heat treatment by heating at 150° C. for 30 minutes to prepare a transparent conductive laminate.

With respect to this transparent conductive laminate, the Hall mobility and carrier density before the heat treatment (immediately after the sputter film formation) and after the heat treatment were measured in the same manner as described above. In addition, the resistivity, the light transmittance at 550 nm, and the resistivity five minutes after immersion in a 5% HCl aqueous solution were measured before and after the heat treatment. The results obtained are shown in Table 4 below.

TABLE 4

|  | Before heat treatment | After heat treatment |
|---|---|---|
| Hall mobility ($cm^2/V \cdot S$) | 27 | 28 |
| Carrier density (number/$cm^3$) | $3.3 \times 10^{20}$ | $2.5 \times 10^{20}$ |
| Resistivity ($\Omega$/square) | 350 | 450 |
| Light transmittance (%) | 85 | 85.5 |
| Resistivity five minutes after immersion in 5% HCl aqueous solution ($\Omega$/square) | $\infty$ | $\infty$ |

As is clear from the above results, an enhancement in the light transmittance before and after the heat treatment was not substantially found; and the resistivity five minutes after the immersion in a 5% HCl aqueous solution was also indefinite ($\infty$) even after the heat treatment. Hence, although the etching processing with an acid could be performed, the resulting film was poor in stability against an acid in proportion thereto. Incidentally, separately from the above tests, the transparent conductive laminate after the heat treatment was subjected to wet heat test in the same manner as described above. As a result, the change rate in resistivity against the initial resistivity before the test became 2.0 times. Therefore, the transparent conductive laminate after the heat treatment was poor in wet heat confidence as compared with that in Example 2.

In the light of the above, according to the invention, in sputter film formation of a transparent conductive layer comprising an In—Sn composite oxide on a substrate comprising an organic polymer molding at a temperature of 80 to 150° C., which is a practically allowable heating temperature of the substrate, when the transparent conductive layer having a film thickness of from 15 to 50 nm is formed by sputtering under conditions that the content of Sn in a target is low, an atmosphere where evacuation is performed to a prescribed degree of vacuum, thereby eliminating the moisture and impurities such as organic gases generated from the substrate, is employed, and that an oxygen gas in a slight amount such that the plasma emission intensity of In delicately fluctuates is introduced thereinto together with an Ar gas, and the resulting film is heat treated at low temperature of 120 to 150° C. for a short period of time 0.5 to 1 hour, a transparent conductive laminate having a completely crystallized, transparent conductive layer, which does not cause deteriorations in productivity and material quality, is excellent in transparency and wet heat confidence, and is not excessively low in specific resistivity, can be obtained.

It should further be apparent to those skilled in the art that various changes in form and detail of the invention as shown and described above may be made. It is intended that such changes be included within the spirit and scope of the claims appended hereto.

This application is based on Japanese Patent Application No. 2002-104676 filed Apr. 8, 2002, the disclosure of which is incorporated herein by reference in its entirety.

What is claimed is:

1. A process for producing a transparent conductive laminate comprising a substrate which comprises an organic polymer molding, and formed thereon a completely crystallized, transparent conductive layer comprising an In—Sn composite oxide having an amount of Sn atom of 1 to 6% by weight based on the total weight of In atom and Sn atom and having a film thickness of 15 to 50 nm, a Hall mobility of 30 to 45 $cm^2/V \cdot S$, and a carrier density of $2 \times 10^{20}/cm^3$ to $6 \times 10^{20}/cm^3$, said process comprising:

(a) a step of sputter film formation of a transparent conductive layer comprising an In—Sn composite oxide on a substrate comprising an organic polymer molding including a step of controlling a variation of oxygen gas in response to fluctuations of degrees of oxidation of a target during sputter film formation by using a plasma emission control system, wherein the step (a) is a step in which the target having an amount of Sn atom of 1 to 6% by weight based on the total weight of In atom and Sn atom is used, evacuation is performed to a degree of vacuum of $1.5 \times 10^{-4}$ Pa or lower at a substrate temperature of 80 to 150° C., and a mixed gas of an oxygen gas and an Ar gas is introduced thereinto such, in a step of controlling the variation of oxygen gas;

when a plasma emission intensity of In when only the Ar gas is introduced is defined to be 90, the plasma emission intensity after the introduction of oxygen gas is 30 to 40 for when the target is a metal target and from 84 to 90 for when the target is an oxide target, respectively, to form an amorphous transparent conductive layer comprising an In—Sn composite oxide having an amount of Sn atom of 1 to 6% by weight based on the total weight of In atom and Sn atom and having a film thickness of 15 to 50 nm, a Hall mobility of 15 to 28 $cm^2V \cdot S$, and a carrier density of $2 \times 10^{20}/cm^3$ to $5 \times 10^{20}/cm^3$ on the substrate; and (b) a step of subsequent post-heating after sputter film formation to produce the transparent conductive laminate, wherein the step (b) is a step in which the amorphous transparent conductive layer formed in the step (a) is subjected to heat treatment in air at 120 to 150° C. for 0.5 to 1 hour, to convert the amorphous transparent conductive layer into a completely crystallized transparent conductive layer having a Hall mobility of 30 to 45 $cm^2V \cdot S$ and a carrier density of $2 \times 10^{20}/cm^3$ to $6 \times 10^{20}/cm^3$.

2. The process as claimed in claim 1, wherein the amount of Sn atom in the target is 2 to 5% by weight.

3. The process as claimed in claim 1, wherein said substrate temperature is about 100° C.

4. The process as claimed in claim 1, wherein said film thickness is 20 to 40 nm.

* * * * *